United States Patent [19]

Odijk

[11] Patent Number: 4,757,469
[45] Date of Patent: Jul. 12, 1988

[54] METHOD OF ADDRESSING A RANDOM ACCESS MEMORY AS A DELAY LINE, AND SIGNAL PROCESSING DEVICE INCLUDING SUCH A DELAY LINE

[75] Inventor: Eddy A. M. Odijk, Eindhoven, Netherlands

[73] Assignee: U.S. Philips Corporation, New York, N.Y.

[21] Appl. No.: 825,178

[22] Filed: Feb. 3, 1986

[30] Foreign Application Priority Data

Feb. 25, 1985 [NL] Netherlands ............... 8500526

[51] Int. Cl.$^4$ ............................................. G06F 12/00
[52] U.S. Cl. ..................................... 364/900; 365/194
[58] Field of Search ... 364/200 MS File, 900 MS File; 365/73, 76, 77, 194

[56] References Cited

U.S. PATENT DOCUMENTS

| 4,101,973 | 7/1978 | Tromp | 365/76 X |
|---|---|---|---|
| 4,213,191 | 7/1980 | Gemp | 365/73 |
| 4,511,966 | 4/1985 | Hamada | 364/200 |
| 4,608,554 | 8/1986 | Blair | 364/200 X |
| 4,689,738 | 8/1987 | van Wijk | 364/200 |

*Primary Examiner*—David Y. Eng
*Assistant Examiner*—Florin Munteanu
*Attorney, Agent, or Firm*—Thomas A. Briody; Jack E. Haken; Anne E. Barschall

[57] ABSTRACT

A random access memory is used to realize a sequence of delay lines (40, 46, 48, 50). The delay lines are linked so that a common end point of two delay lines can be addressed in a read/modify/write operation. Furthermore, the address step between two successive data elements of the delay line is increased, so that the new address must be calculated modulo the length of the consecutive zone reserved for the delay lines. It has been found that in many cases the incrementation step between the various read addresses has a value which can be expressed in a number of bits which is smaller than the number of bits necessary to express the length of the consecutive memory zone itself.

12 Claims, 3 Drawing Sheets

METHOD OF ADDRESSING A RANDOM ACCESS MEMORY AS A DELAY LINE, AND SIGNAL PROCESSING DEVICE INCLUDING SUCH A DELAY LINE

BACKGROUND OF THE INVENTION

1. Field of the Invention

The invention relates to a method of addressing a random access memory having an address length of n bits so that it operates as a delay line having length of L memory positions, each of which can accommodate one multibit data element. The method involves the assignment of an available memory zone to any delay as well as the following recurrent steps:

- addressing the memory zone by means of a read pointer in order to read a data element,
- addressing the memory zone by means of a write pointer which is situated at a predetermined distance from the read pointer in order to write a data element;
- preparing a next read pointer by means of an incrementation operation.

2. Prior Art

Such a method is known from the published British Pat. No. 2,115,588, notably from FIG. 15. The memory control requires four address data, that is to say a running read address, a running write address, a start address and an end address. The running addresses are compared with the end address. When the end address is reached, the start address is input as the new running address. Different delay lines can thus be simultaneously implemented in a memory, for which each time four address quantities must be retained. Consequently, a complex bookkeeping organization is required.

SUMMARY OF THE INVENTION

The present invention recognizes the fact that different delay lines are often addressed in a synchronized manner, which means that the respective source data are presented in synchronized form or that the destination data are fetched in synchronization form. The data width (for example, word width) need not be the same for the different delay lines. Moreover, the rate of presentation of the respective source data need not always be the same. In this respect a simple relationship may exist, for example 1:2. In all above cases synchronization can be achieved in a simple manner by dividing one or more delay lines into sections which are arranged as secondary delay lines in parallel as if it were. It is an object of the invention to accelerate the addressing of the memory, on the one hand at the level of the single memory cycle by concentrating as large a number as possible of elementary memory operations therein, and on the other hand at the level of the formation of read/-write operations by limiting the number of bits of the address incrementation. In this way the data bus, which is usually narrower than the address width can also be used for transporting the addresses while still only a comparatively small number of address transport operations per memory operation is required. It is also an object to realize this advantage when the width of the address bus is smaller than the width of the total address, for example when the latter consists of a combination of a row address and a column address in the memory matrices.

The object in accordance with the invention is achieved as follows. For addressing a plurality of delay lines in synchronism, the delay lines are coupled in a sequence. The value of the write pointer for a preceding delay line of the sequence equals the value of the read pointer for the next delay line of the sequence, if any. An address thus pointed out twice is addressed in a read/modify/write operation. The address step between two successive data elements of the same delay line has a value p which is larger than one, and is realized in an uninterrupted memory zone available for said plurality of delay lines, modulo the length of said memory zone. The data elements of the various delay lines thus are stored in said memory zone in an intermingled manner. The incrementation step $I=(p \times L)$, modulo the length of said memory zone, has a value which can be expressed, in at least one recurrent period of the delay cycle for at least one delay line, as a number of address bits which is smaller than the number of bits required for expressing the length of said memory zone itself. For a 64k memory capacity, for example, 16 address bits are required. When the length of the delay line amounts to, for example, 256 data elements, according to the described solution, an incrementation step which can be expressed in a number of bits which is substantially smaller than 16 bits, supplies in many cases.

It has been found that the value p and the length of said memory zone preferably do not have a common factor larger than 1. The entire memory zone can thus be completely traversed in succession without memory positions being skipped, thus reducing the effective capacity thereof, or without complicating the organization with a plurality of memory sub-zones.

The invention also relates to a signal processing device including such a delay line; signal processing devices are commonly used and usually require the implementation of several mutually synchronized delay lines therein. The present invention results in faster memory access in many cases, so that either the machine cycle of the signal processing device need not be extremely short or more time remains for the execution of functions other than said delay lines.

BRIEF DESCRIPTION OF THE FIGURES

The invention will be described in detail hereinafter with reference to some figures.

DESCRIPTION OF THE PREFERRED EMBODIMENTS

Figure 1:
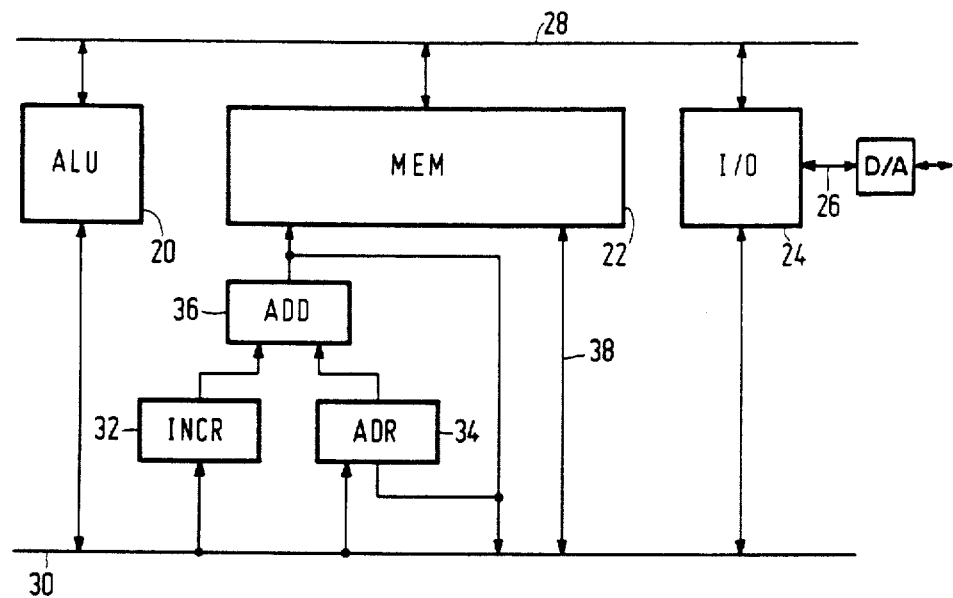
FIG. 1 shows a simple block diagram of a signal processing device in accordance with the invention.

FIG. 1 shows a simple block diagram of a signal processing device in accordance with the invention. This elementary set-up includes an arithmetic and logic unit 20, a random access read/write memory 22, and an input/output component 24 for communication with the environment. Also provided is a control bus 28 which includes various connections for the exchange of control signals between the elements. This control bus is selectively connected as far as necessary. Line 26 is the connection to the environment. Line 30 is a data bus. In order to save bus lines, no separate address bus is provided. The data bus in the present embodiment has a width of 8 bits. The memory 22 has a capacity of $2^{16}$ (64k) 8-bit words and hence requires 16 address bits. To this end there is provided an address processing unit which includes an address register 34, an increment register 32, and an address adder 36. The elements 34, 36 have a data path width of 16 bits, and the element 32 has a data path width of 9 bits. The address adder formed can be returned from the address 36 to the register 34. The register 34 can be filled from the data bus in two operations. When an incrementation over a width exceeding 8 bits is to be performed, the incrementation quantity is transferred in two transport operations and the address operation is performed while implementing a shift operation over the relevant part of the incrementation quantity. The specific control connections for the elements 32, 34, 36 have been omitted for the sake of simplicity. Line 38 is the data line connection of the memory 22.

In another embodiment, the data bus has a width of 12 bits which is again smaller than the address length. Even when a separate address bus is present, the solution to be described hereinafter if advantageous when an address quantity having the maximum feasible length cannot be transferred during a single bus transport. In the case of signal processing, successive quantities are usually dealt with in a corresponding manner, for example in that they represent digitized sample values of a continuous signal such as an audio signal. Therefore, usually different filter functions are required which are implemented by digital means. These filters in many cases comprise delay lines. Digital signal processing devices are known per se; for example, reference is made to European Patent Application No. 154051 (PHN 10886) in the name of applicant.

DESCRIPTION OF A DELAY LINE

Figure 2:
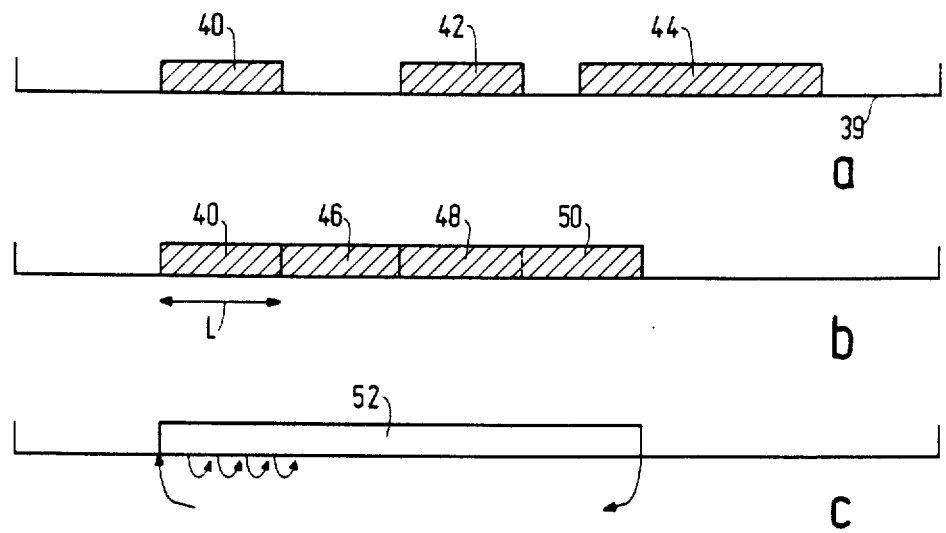
FIGS. 2a-2c illustrate the operation of a delay line.

FIGS. 2a ... 2c illustrate the operation of a delay line. The line 39 represents the address space, so that a memory zone corresponds to a given distance along this line. Three delay lines 40, 42, 44 are thus implemented. In the present embodiment the lines 40, 42 have the same number of data elements. The line 44 has twice as many data elements. The latter may be for two reasons:

(a) the data does not fit within a single memory position, so that it must be distributed between two memory positions; for each memory access to the delay lines 40, 42, therefore, two memory access operations must be performed in the delay line 44;

(b) the delay time to be implemented by the latter delay line is twice as long (it will be apparent that other ratios of the lengths are also feasible).

First the case (a) will be considered. The use of read/write addresses and separate boundary addresses for all delay lines is very complex. Therefore, first the conversion to FIG. 2b will be described. Therein, the delay lines are linked, the delay line 42 being subjected to an address modification, so that it becomes line 46. The delay line 44 is split into the delay lines 48, 50. In this set-up the delay line 48, for example, always receives the least significant parts of the data and the delay line 50 receives the more-significant parts. At the boundary of two delay lines, a read operation and a write operation are always combined. Subsequently, an address modification is performed over L memory positions and the access is repeated. The memory zone occupied may then be shifted towards the boundaries of the overall memory space or to the boundary of a smaller assigned zone. When the upper boundary is exceeded due to an incrementation operation, the number representing the length of the combined delay lines in address positions is subtracted therefrom in a modulo operation. The assigned zone is thus always cyclically traversed. A read/modify/write cycle requires less time than the sum of a read cycle and a write cycle. The operation is thus accelerated.

The set-up chosen is still imperfect in the following respect: address incrementation must take place for each memory cycle, i.e. over a distance L. When the address length of the entire memory amounts to n bits, the incrementation step may have an arbitrary value. When this value is fixed, it will not be objectionable; however, if different distances are incremented, this information must be supplied each time via the bus. When the length of the distance, expressed in bits, involves more bits than the bus is wide, two (or more) transport cycles will be required, thus reducing the speed of operation. Therefore, a different solution is realized in FIG. 2c. By mixing the various delay lines, a smaller distance as expressed in the number of physical memory positions is achieved (denoted by the small arrows). A single bus transport now suffices for each incrementation step. As will be described hereinafter, this cannot be realized in all cases for all incrementation steps.

EXAMPLES OF THE POSITIONING OF THE DATA ELEMENTS

FIGS. 3a–3h show first examples of the positioning of the data elements in a memory. In this simple example the memory comprises 16 address positions which are denoted by a corresponding number of squares. There are two delay lines. The first delay line includes the data elements A1, B1, C1, ... G1 in this instantaneous situation, so in total seven data elements. The second delay line similarly comprises the seven elements A2 ... G2. The address step between two successive data elements of these delay lines is $p=1$. This is denoted by the connecting arrow 100. The incrementation step between the read address of the first line (at A1) and the read address of the second line = write address of the first line (at A2, where H1 is written) has a value 7. Therefore, this can be expressed in three bits, which is one bit less than the total address width of 4 bits. The incrementation step between the read address of the second delay line and the write address of this line (where H2 is written) also has a value 7. The further incrementation step back to the new read address of the first delay line then has a value $p \times k$, in which k is the number of empty positions in the zone, increased by 1. Therefore, in this case $k=3$. This value can be expressed in two bits because the address is calculated modulo the length of the assigned memory zone. The two empty positions may be considered to form part of a dummy delay line which, therefore, has a length $L'=k=3$. Consequently, per cycle two incrementation steps must be performed: alternately 7 (used twice) and 3. When the address bus has a width of 3 bits, two transports will then be required. When the bus has a width of 2 bits, three transports will be required. When other memory addressing operations must be performed between two addressing cycles for the delay lines, it will necessary to transport once the actual start address and one 3-bit incrementation step. When the bus has a width of three bits, three transports will be required. When the bus has a width of two bits, even four bus transports will be required.

For the same two delay lines FIG. 3b shows an address step of three positions (arrow 102). When all sixteen memory positions are available, the incrementation step then equals 5: all address calculations are now performed modulo 16. The incrementation step (arrow 104) can again be expressed in three bits. The incrementation step I can be calculated:

$$I = (p \times L) \bmod G = (3 \times 7) \bmod 16 = 5;$$

L is the length of the delay line expressed in the number of data elements;

G is the length of the memory zone expressed in memory positions.

The incrementation step for the dummy delay line is $3 \times k = 9$, which can be expressed in four bits. For the various bus widths, the number of bus transports per cycle amounts to:

| with dummy line | without dummy line |
|---|---|
| 2 4 | 4 |
| 3 3 | 3 |

(two equal incrementation steps need be transported only once).

For the same two delay lines, FIG. 3c shows an address step of five positions (arrow 106). The incrementation step (arrow 108) now amounts to three positions, which can be expressed in two bits: $I = (5 \times 7) \bmod 16 = 3$. For the dummy delay line the incrementation step now equals $p \times 3 = 15$.

FIG. 3d shows an address step of 7 positions (110) and the incrementation length now amounts to one position (112): $I = (7 \times 7) \bmod 16 = 1$. For the dummy delay line the incrementation step now amounts to $7 \times p = 21 \bmod 16 = 5$.

FIG. 3e shows an address step of 9 positions (114). The incrementation step now amounts to 15 positions, which can only be expressed in four bits. For the dummy delay line the incrementation step equals 11. Similarly, the further figures successively show (including the incrementation step for the dummy delay line (I')):

3f: p=11; I=13; I'=1

3g: p=13; I=11; I'=7

3h: p=15; I=9; I'=13.

Notably the figures 3b, 3c, 3d concern a limited incrementation step for the "real" delay lines. For the "dummy" delay line, notably the figures 3a, 3d, 3f have a limited incrementation step. Depending on the occurrences of the various incrementation steps, one solution or another will offer the best results. It has been found that the quantity p and the length of the memory zone (in this case 16 positions) do not have a factor larger than "1" in common. In that case the delay lines extend through the entire zone. When the factor is larger, for example 2, the memory positions appear to form part of different categories: the delay lines are then restricted to the one or the other category. This aspect does not offer special advantages, but usually it is not objectionable either.

Similarly, the figures 4a ... 4d show the implementation of two synchronized delay lines of unequal length. The lengths are indicated:

|  | L1 | L2 | p-opt | I1 | I2 |
|---|---|---|---|---|---|
| 4a | 7 | 5 | 7 | 1 | 3 |
| 4b | 7 | 6 | 3 | 5 | 2 |
| 4c | 9 | 6 | 11 | 3 | 2 |
| 4d | 8 | 7 | 7 | 8 | 1 |

Each time the optimum value for the address step is chosen. Other address steps each time result in a larger maximum incrementation length, the dummy delay line not being considered in this respect. The invention can be similarly used when a memory zone having a different length is assigned or when several delay lines have to be provided. It has been found that in most cases an attractive address step value van be found in order to reduce the maximum incrementation length.

Figure 5:
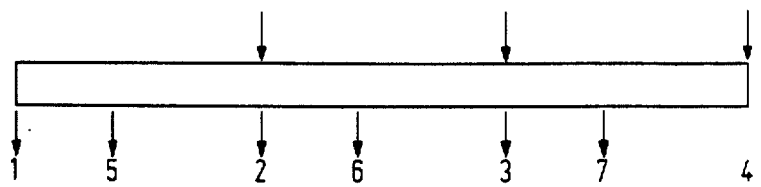
FIG. 5 shows a further example of a memory organization operating as a delay line.

FIG. 5 shows a further example of a memory organization. Three delay lines having the same length are provided, each delay line being represented by a block. In each delay line a read operation is recurrently performed at the beginning and a write operation is performed at the end. Moreover, a further read operation takes place in the centre, so that a sub-delay line is formed. The figure does not yet show the intermingling of the delay lines by increasing the address step. In this respect reference is made to the other figures. Numerals indicate the sequence in which the elementary memory operations are performed. First a read operation is performed at "1". Subsequently, at "2" a read/modify/-write operation is performed. This operation is repeated at "3". Finally, at "4" a write operation takes place. Subsequently, the read operations are performed at "5", "6", "7". Further simplification can thus be obtained in that usually similar operations (read, read/modify/-write) are performed in a sequence. Furthermore, the incrementation step between corresponding operations is usually the same (for example, between 5, 6, 7).

Figure 3:
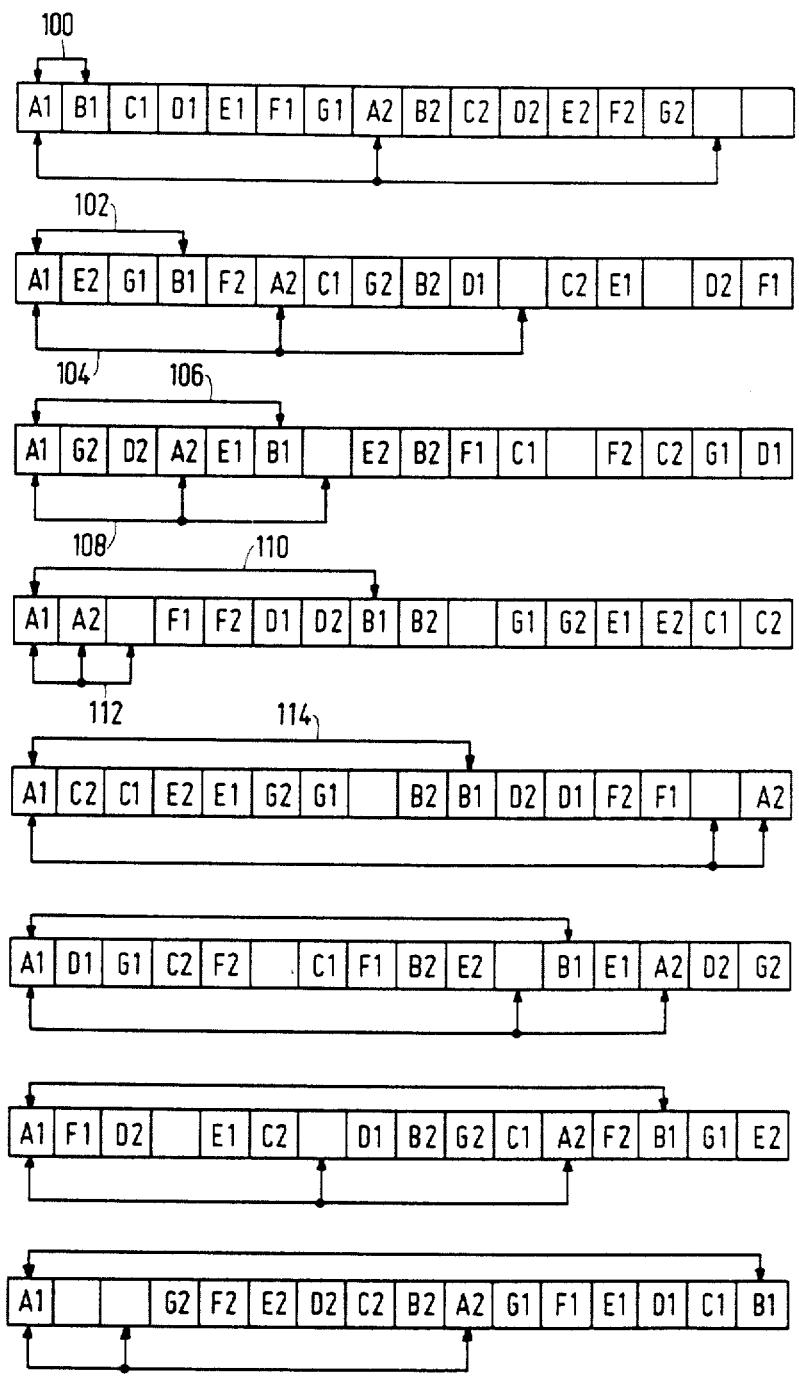
FIGS. 3a-3h show first examples of the positioning of the data elements in a memory.
Figure 4:
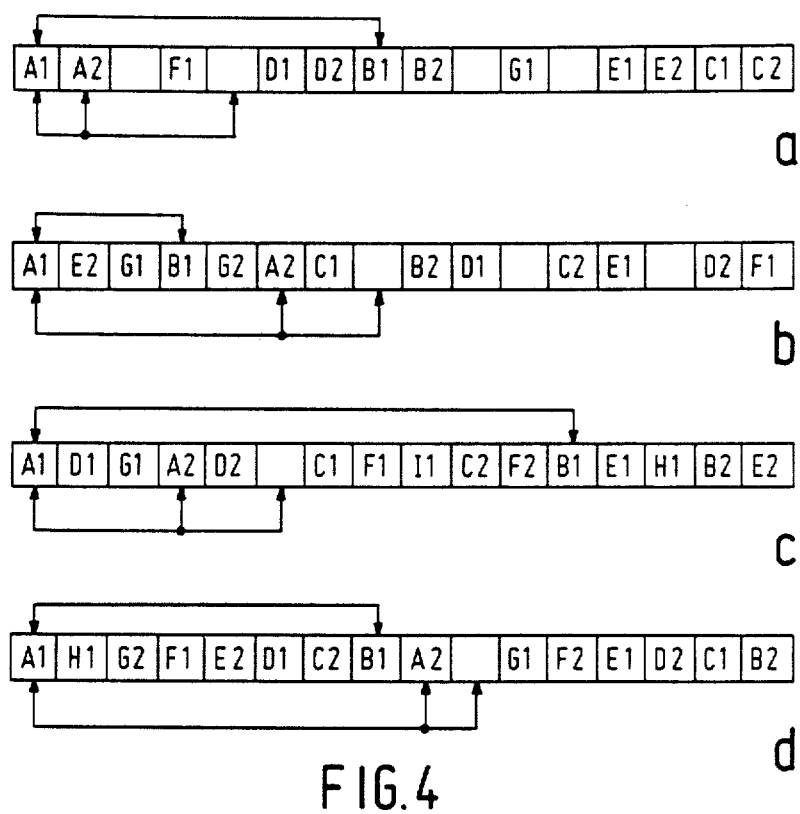
FIGS. 4a-4d show second examples of such positioning.

In the FIGS. 3, 4 the assigned memory zone may always be filled with data elements. The invention also relates to a signal processing device including a delay line device of the described kind. A converter is then required either at the input or the output, or at the input as well as the output in order to convert an analog signal into a digital signal and/or vice versa.

What is claimed is:

1. A method of addressing a random access memory comprising a plurality of addressable memory positions and an available memory zone having a length, each position being for storing one multibit data element, the addressing being such that the memory zone acts as at least one delay line having a delay length of L memory positions, the method comprising, for each delay line, the steps of:

a. first addressing the memory zone using a read pointer in order to read a data element;

b. second addressing the memory zone using a write pointer, which specifies an address situated at a predetermined distance from the read pointer in order to write a data element;

c. preparing a next read pointer using an incrementation operation;

d. repeating steps a–c in a delay cycle having a period;

wherein the improvement comprises:

e. coupling in sequence a plurality of delay lines, which are to be addressed synchronously and which are located in the memory zone, which is uninterrupted, so that for first and second sequential delay lines, an address value of the write pointer for the first delay line equals an address value of the read pointer for the second delay line;

f. addressing the memory using the address value in a read/modify/write operation;

g. using an address step value p, modulo the length of said memory zone, between two successive data elements of the same delay line, where p is greater than one, so that data elements of the various delay lines are stored in said memory zone in an intermingled manner;

h. using an incrementation step value for said incrementation operation of $I=(p\cdot L)$ modulo the length of said memory zone, I having a value which can be expressed, in at least one of the periods of one of the delay lines, as a number of address bits which is smaller than a number of bits required for expressing the length of said memory zone.

2. A method for addressing a random access memory so that the memory operates as first and second synchronized spatially intermingled delay lines having addressable positions located within a memory zone of G contiguous positions, said method comprising the steps of:

a. accessing, in a read operation, a first position at a first address, so that said first position acts as an initial position of the first delay line, the first delay line comprising L1 positions;

b. incrementing said first address with a first address incrementation quantity $I1=p\cdot L1$, modulo the length G of said memory zone, to yield a second address, p being an integer greater than one which represents an address step distance between memory positions within a same delay line;

c. accessing, in a read operation, a second position at said second address as an initial position of the second delay line, the second delay line comprising L2 positions;

d. executing a modify/write operation at said second address, so that said second address acts as a terminal position of said first delay line;

e. incrementing said second address with a second address incrementation quantity $I2=p\cdot L2$, modulo the length G of said memory zone, to yield a third address;

f. accessing, in a write operation, a third position at said third address, so that said third address acts as a terminal position of said second delay line;

g. updating said first address with a fourth address which is at the address step distance p with respect to said first address; and h. returning to step (a) so as to cycle through the first and second delay lines;

wherein at least one of said first and second address incrementation quantities is expressed in a number of bits less than a number of bits required for expressing the length G of said memory zone.

3. A method for addressing a random access memory so that the memory acts as a plurality of m synchronized spatially intermingled delay lines having addressable positions located within a memory zone of G contiguous positions, said method comprising the steps of:

a. accessing, in a read operation, a first position at a first address, so that said first position acts as an initial position of an i-th delay line, the i-th delay line comprising Li positions, i being equal to one in a first pass through the method;

b. incrementing said first address with a first address incrementation quantity $Ii=p\cdot Li$, modulo G, to yield a second address, p being an integer greater than one which represents an address step distance between memory positions within a same delay line;

c. accessing, in a read operation, a second position at said second address as an initial position of an (i+1)-st delay line, the (i+1)-st delay line comprising L(i+1) positions;

d. executing a modify/write operation at said second address, so that said second address acts as a terminal position of said i-th delay line;

e. incrementing said second address with an (i+1)st incrementation quantity $I(i+1)=p\cdot L(i+1)$, modulo G, to yield a next address;

f. incrementing i by 1;

g. returning to step c. and using the next address as the second address therein so long as i<m, but when i=m using said next address as a third address and going to step h.;

h. accessing, in a write operation, a third position at said third address, so that said third position acts as a terminal position of the m-th delay line;

i. updating said first memory address with a fourth address which is at the address step distance p with respect to said first memory address;

j. returning to step a. so as to cycle through the plurality of delay lines;

when at least one of said address incrementation quantities is expressed in a number of bits less than the number of bits required for expressing G.

4. The method of claim 2 or 3 wherein said updating of said first memory address comprises the step of incrementing said third address with an ultimate address incrementation quantity p·k, modulo G, where k is G minus the sums of the lengths of the delay lines plus one.

5. The method of claim 2 or 3 wherein p and G are relatively prime.

6. The method of claim 2 or 3 further comprising the step of maintaining a delay line having a bit width larger than a number of bits which can be stored in a single addressable position, wherein data are divided into a plurality of j data elements having smaller lengths, said maintaining comprising the step of delaying the data elements in a plurality of j delay lines.

7. The method of claim 2 or 3 wherein at least two of the delay lines have different delay lengths.

8. The method of claim 2 or 3 comprising, after the step of accessing said third position, the step of accessing at least two of said delay lines in a read only operation so that partial delay lengths are realized.

9. A signal processing device comprising:

a. an I/O subsystem;

b. a memory for storing data in a plurality of m synchronously accessible delay lines of respective lengths of Li memory positions, where i is an integer running from 1 to m, said memory having a predetermined first address bit width and comprising:

i. an increment register for storing an address increment;

ii. an accumulator for incrementing an actual address of said memory with the address increment;

iii. a contiguous memory zone for implementing said delay lines, said contiguous memory zone having a number G of addressable positions;
c. a processing element for:
  i. accessing a first initial memory position of a first delay line in a read operation;
  ii. providing a sequence of m address increments $Ii=p \cdot Li$, modulo G, where p is an address step distance greater than 1, said address increments being provided to produce addresses of respective further initial memory positions of respective further delay lines, so that a read/modify/write operation is executed at each said further initial position, except that for the m-th address increment, only a write operation is executed, said address increments being provided at a second address bit width less than said first address bit width; and
  iii. updating an address of the first initial memory position by incrementing the address of the first initial memory position by said address step distance p, after the write operation for the m-th address increment, and thereupon returning control to said means for accessing; and
d. a bus system for interconnecting said processing element, said I/O subsystem, and said memory, said bus system being for transporting data to said processing element and memory and for transporting said address increment to said increment register at said second address bit width.

10. The signal processing device of claim 9 wherein the bus system has a common bus line for data and addresses.

11. The signal processing device of claim 9 wherein said second bit width is at least two bits smaller than said first bit width.

12. A signal processing apparatus including at least one signal processing device as claimed in any one of the claims 9, 10, or 11, characterized in that there are also provided a connection for the communication of audio signals with the environment and a converter for realizing a conversion between analog and digital signals, the analog side thereof being connected to the latter connection while the digital side is connected to said signal processing device.

* * * * *